(12) United States Patent
Kim et al.

(10) Patent No.: US 7,851,893 B2
(45) Date of Patent: Dec. 14, 2010

(54) SEMICONDUCTOR DEVICE AND METHOD OF CONNECTING A SHIELDING LAYER TO GROUND THROUGH CONDUCTIVE VIAS

(75) Inventors: Seung Won Kim, Kyunggi-Do (KR); Dae Wook Yang, Kyunggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 358 days.

(21) Appl. No.: 12/136,723

(22) Filed: Jun. 10, 2008

(65) Prior Publication Data

US 2009/0302437 A1 Dec. 10, 2009

(51) Int. Cl.
*H01L 21/50* (2006.01)
*H01L 23/02* (2006.01)

(52) U.S. Cl. .............. 257/659; 257/621; 257/660; 257/728; 257/E23.114; 257/E23.13; 438/121

(58) Field of Classification Search .......... 257/621, 257/659, 660, 728, E23.114, E23.13; 438/121
See application file for complete search history.

(56) References Cited

U.S. PATENT DOCUMENTS

| | | | | |
|---|---|---|---|---|
| 5,371,404 | A * | 12/1994 | Juskey et al. ............... | 257/659 |
| 6,294,731 | B1 * | 9/2001 | Lu et al. ..................... | 174/388 |
| 6,400,032 | B1 * | 6/2002 | Akram ....................... | 257/778 |
| 6,649,446 | B1 * | 11/2003 | Goetz et al. ................ | 438/110 |
| 7,030,649 | B1 | 4/2006 | Balasubramanian et al. | |
| 7,148,576 | B2 | 12/2006 | Nemoto | |
| 7,187,071 | B2 * | 3/2007 | Tsuneoka et al. .......... | 257/691 |
| 7,261,596 | B2 | 8/2007 | Akaike et al. | |
| 2002/0189834 | A1 | 12/2002 | Goetschalckx | |
| 2004/0240191 | A1 * | 12/2004 | Arnold et al. .............. | 361/800 |
| 2006/0194370 | A1 * | 8/2006 | Lee et al. .................... | 438/118 |
| 2006/0267159 | A1 * | 11/2006 | Yamamoto et al. ......... | 257/659 |
| 2007/0023895 | A1 * | 2/2007 | Watanabe et al. ........... | 257/724 |
| 2007/0045829 | A1 * | 3/2007 | Jeong et al. ................. | 257/723 |
| 2007/0075413 | A1 * | 4/2007 | Egawa ........................ | 257/686 |
| 2007/0138614 | A1 | 6/2007 | Harrison et al. | |
| 2007/0164409 | A1 * | 7/2007 | Holland ..................... | 257/678 |
| 2008/0061407 | A1 * | 3/2008 | Yang et al. ................. | 257/660 |

\* cited by examiner

*Primary Examiner*—Eugene Lee
*Assistant Examiner*—Peniel M Gumedzoe
(74) *Attorney, Agent, or Firm*—Robert D. Atkins

(57) ABSTRACT

A semiconductor device is made by providing a substrate having an interconnect structure, providing a plurality of semiconductor die each having a through silicon via (TSV), mounting the semiconductor die to the substrate to electrically connect the TSV to the interconnect structure, depositing an encapsulant between the semiconductor die, and forming a shielding layer over the encapsulant and semiconductor die. The shielding layer is electrically connected to the TSV which in turn electrically connects to the interconnect structure to isolate the semiconductor die from interference. The shielding layer is electrically connected to a ground potential through the TSV and interconnect structure. The semiconductor die includes solder bumps which are electrically connected to contact pads on the substrate. The substrate also includes solder bumps electrically connected to a conductive channel in the interconnect structure which is electrically connected to the TSV. The substrate is singulated to separate the semiconductor die.

25 Claims, 13 Drawing Sheets

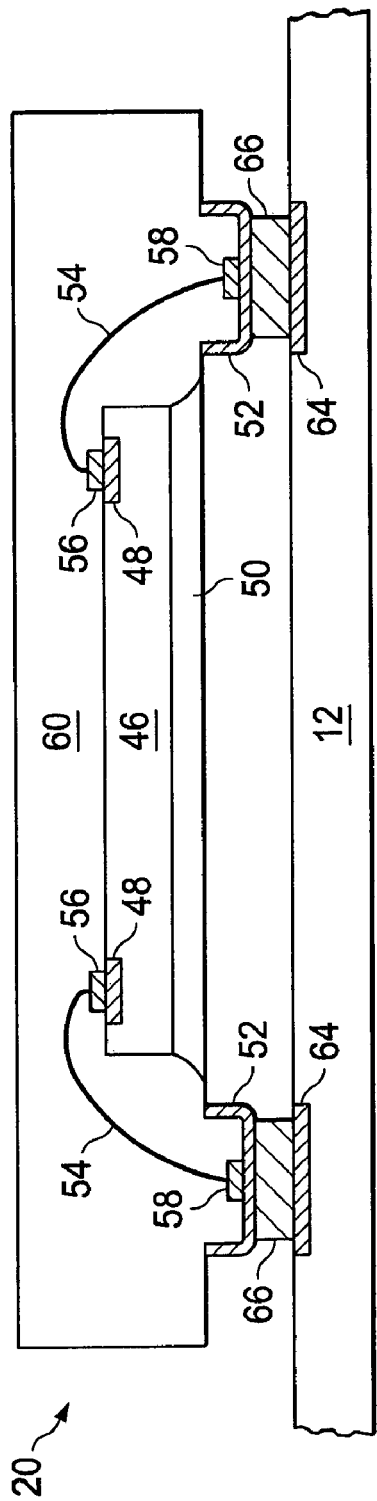
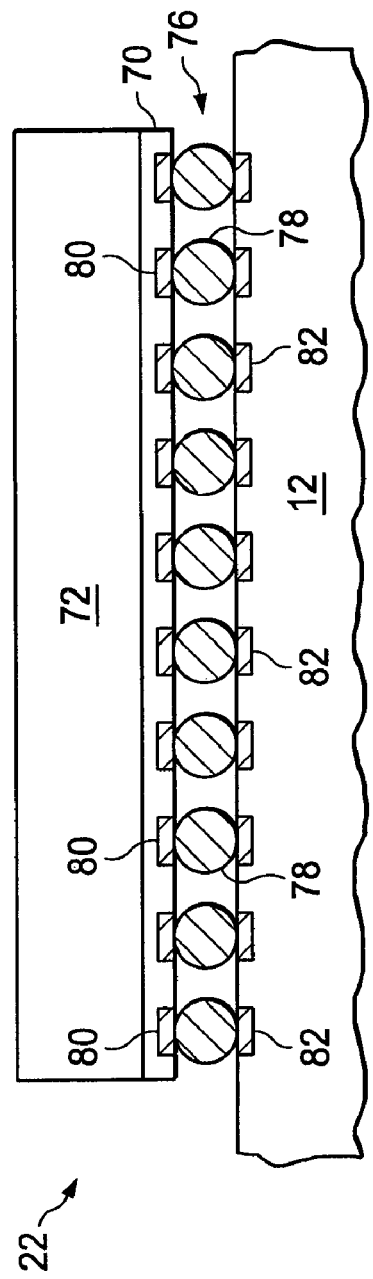
FIG. 2c
FIG. 2d

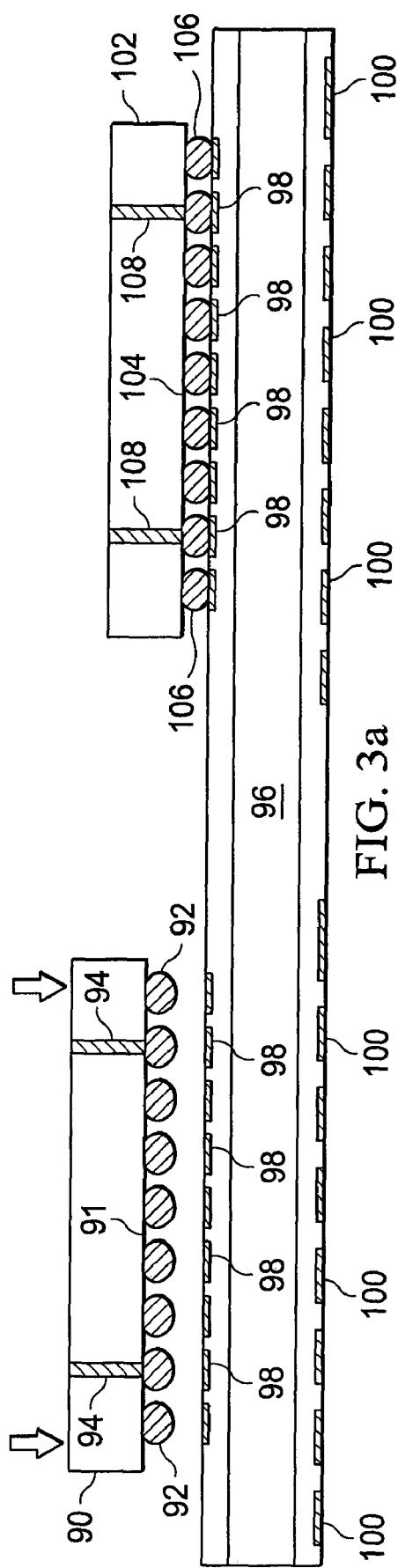
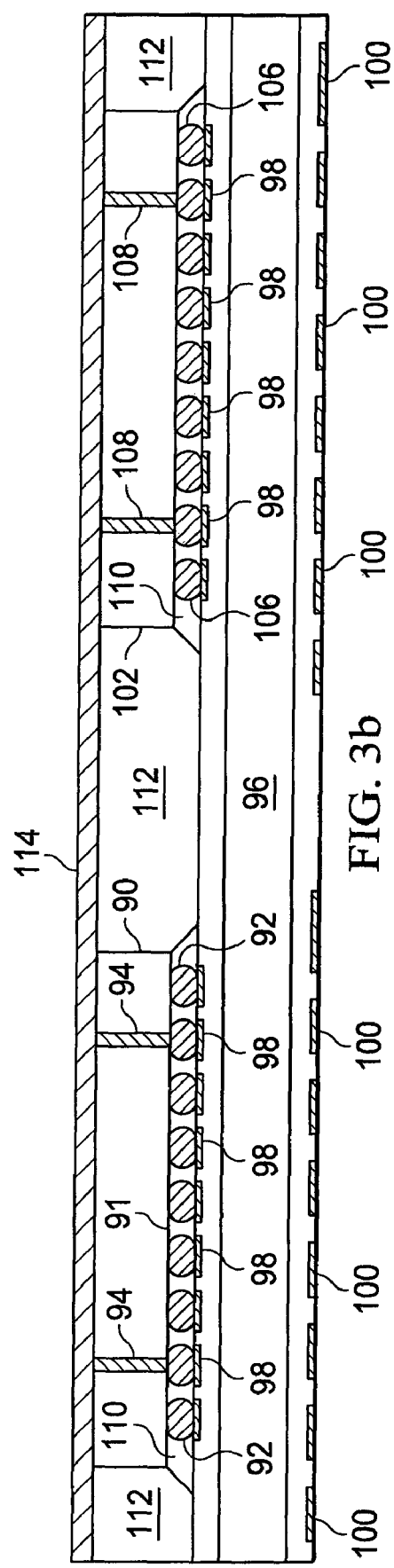
FIG. 3a
FIG. 3b

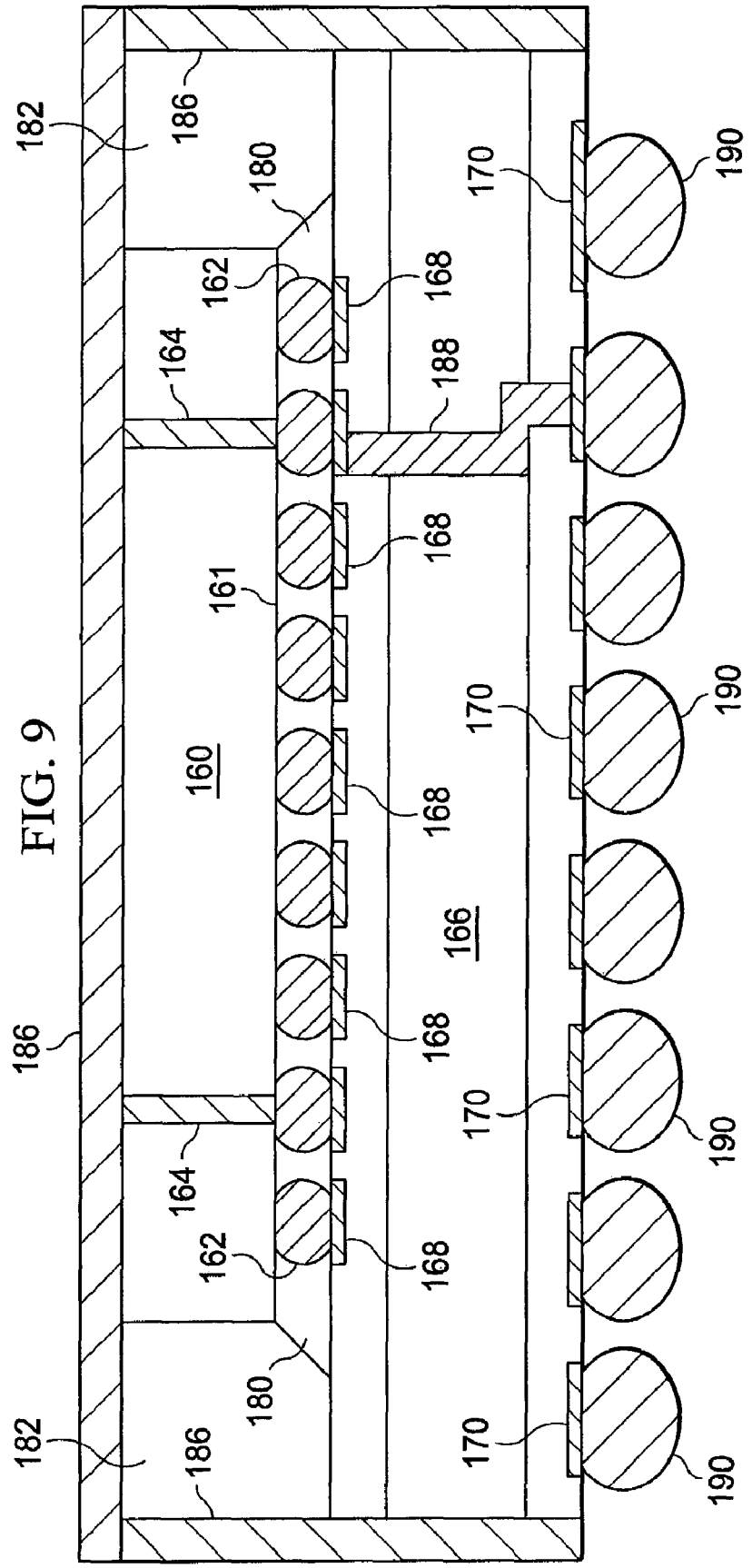

SEMICONDUCTOR DEVICE AND METHOD OF CONNECTING A SHIELDING LAYER TO GROUND THROUGH CONDUCTIVE VIAS

FIELD OF THE INVENTION

The present invention relates in general to semiconductor devices and, more particularly, to a semiconductor device using conductive vias to connect a shielding layer to a ground point.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate undesired electromagnetic interference (EMI) and radio frequency interference (RFI), or other inter-device interference, such as capacitive, inductive, or conductive coupling, also known as cross-talk, which can interfere with the operation of adjacent circuit elements.

To protect the semiconductor devices from EMI and RFI, a shielding layer is typically disposed over the device and connected to ground using a grounding wire or external connection. The semiconductor device substrate may utilize a ground plane. The dedicated ground connections require additional production steps and add costs to the manufacturing process.

SUMMARY OF THE INVENTION

A need exists to shield semiconductor devices from EMI, RFI, and other inter-device interference. Accordingly, in one embodiment, the present invention is a method of making a semiconductor device comprising the steps of providing a substrate having an interconnect structure, providing a plurality of semiconductor die each having a through silicon via (TSV), mounting the semiconductor die to the substrate to electrically connect the TSV to the interconnect structure, depositing an encapsulant between the semiconductor die, forming a shielding layer over the encapsulant and semiconductor die, electrically connecting the shielding layer to the TSV which in turn electrically connects to the interconnect structure to isolate the semiconductor die from interference, and singulating the substrate to separate the semiconductor die.

In another embodiment, the present invention is a method of making a semiconductor device comprising the steps of providing a substrate having an interconnect structure, providing a plurality of semiconductor die each having a TSV, mounting the semiconductor die to the substrate to electrically connect the TSV to the interconnect structure, depositing an encapsulant over the semiconductor die, removing the encapsulant extending above the semiconductor die, forming a shielding layer over the encapsulant and semiconductor die, electrically connecting the shielding layer to the TSV which in turn electrically connects to the interconnect structure to isolate the semiconductor die from interference, and singulating the substrate to separate the semiconductor die.

In another embodiment, the present invention is a method of making a semiconductor device comprising the steps of providing a substrate having an interconnect structure, providing a semiconductor die having a TSV, mounting the semiconductor die to the substrate to electrically connect the TSV to the interconnect structure, depositing an encapsulant between the semiconductor die, forming a shielding layer over the encapsulant and semiconductor die, and electrically connecting the shielding layer to the TSV which in turn electrically connects to the interconnect structure to isolate the semiconductor die from interference.

In another embodiment, the present invention is a semiconductor device comprising a substrate having an interconnect structure. A semiconductor die has a TSV. The semiconductor die is mounted to the substrate to electrically connect the TSV to the interconnect structure. An encapsulant is deposited between the semiconductor die. A shielding layer is formed over the encapsulant and semiconductor die. The shielding layer is electrically connected to the TSVs which in turn electrically connect to the interconnect structure to isolate the semiconductor die from interference.

BRIEF DESCRIPTION OF THE DRAWINGS

FIGS. 2a-2d illustrate further detail of the semiconductor packages mounted to the PCB;

FIGS. 3a-3c illustrate a process of forming a shielding layer with ground connection through a TSV in the semiconductor device;

FIG. 9 illustrates further detail of the shielding layer covering the substrate with ground connection through a TSV.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
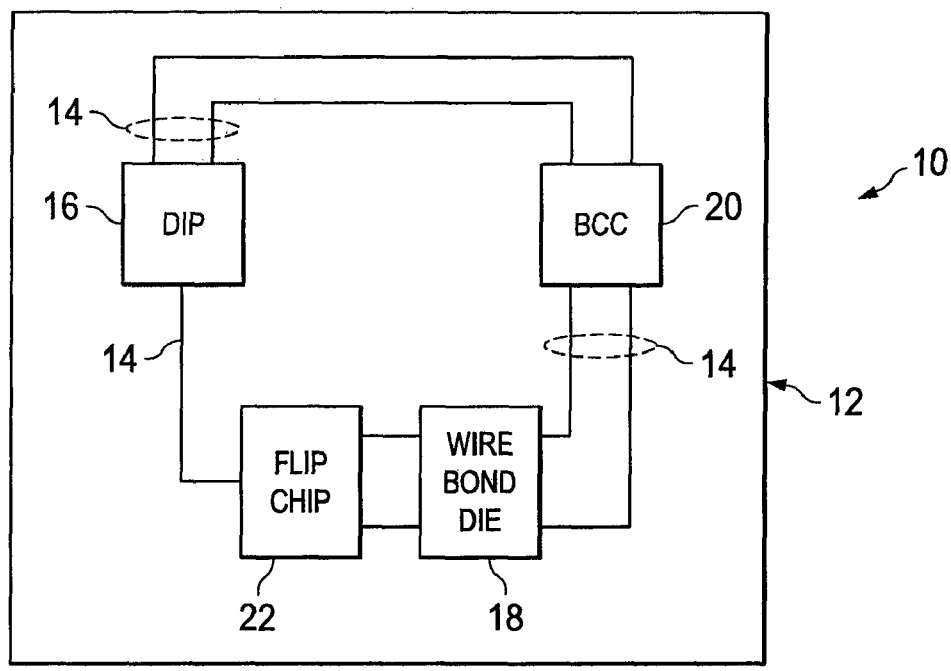
FIG. 1 illustrates a PCB with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip-chip package 22, are shown mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality and represent known good units (KGUs), electronic devices can be manufactured using cheaper components and shorten manufacturing process. The resulting devices are less likely to fail and less expensive to manufacture resulting in lower costs for consumers.

Figure 2A:
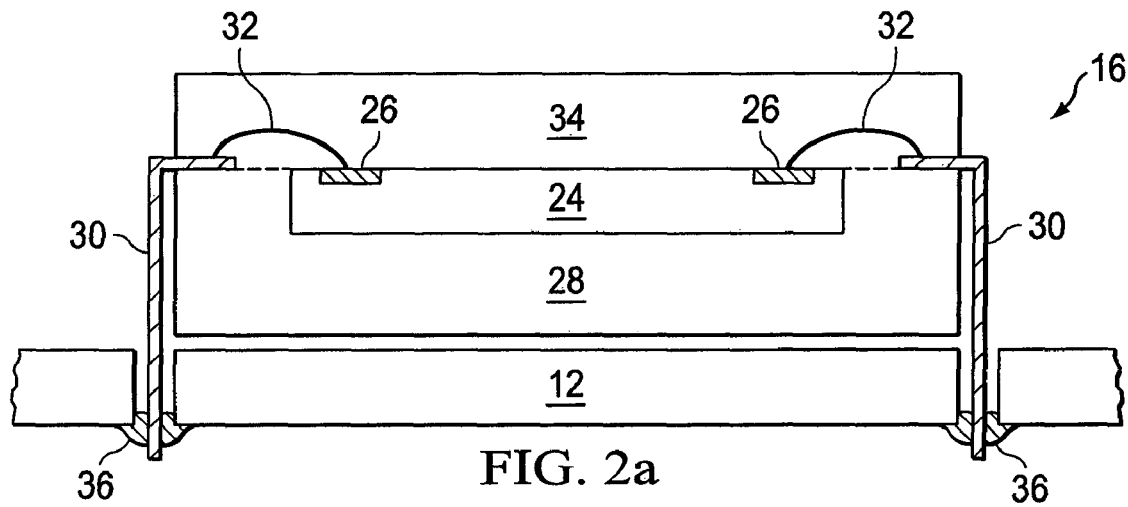

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die. For example, the circuit may include one or more transistors, diodes, inductors, capacitors, resistors, and other circuit elements formed within the active area of die 24. Contact pads 26 are made with a conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process. During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and bond wires 32 are formed between leads 30 and contact pads 26 of die 24. Encapsulant 34 is deposited over the package for environmental protection by preventing moisture and particles from entering the package and contaminating die 24, contact pads 26, or bond wires 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
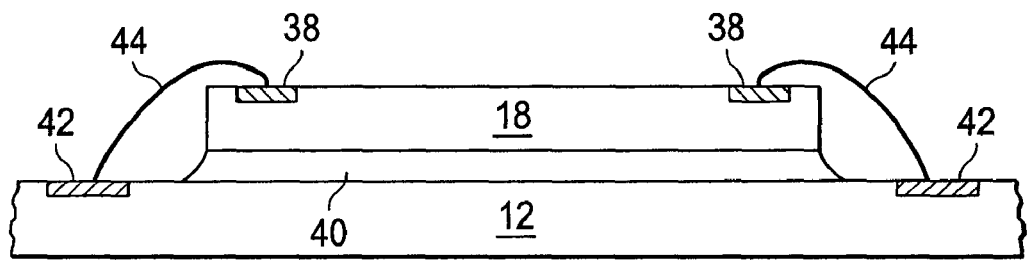

Referring to FIG. 2b, a wire bonded die 18 having contact pads 38 is mounted to PCB 12 using adhesive material 40. Contact pads 42 are formed on the surface of PCB 12 and electrically connect to one or more traces 14 formed on or within the layers of PCB 12. Wire bonds 44 are formed between contact pads 38 of die 18 and contact pads 42 of PCB 12.

FIG. 2c illustrates further detail of BCC 20 with an incorporated semiconductor die, integrated circuit (IC), or combination thereof. Semiconductor die 46 having contact pads 48 is mounted over a carrier using an underfill or epoxy-resin adhesive material 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Wire bonds 54 and bond pads 56 and 58 electrically connect contact pads 48 of die 46 to contact pads 52 of BCC 20. Mold compound or encapsulant 60 is deposited over die 46, wire bonds 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is reflowed to form bumps 66 which form a mechanical and electrical connection between BCC 20 and PCB 12.

In FIG. 2d, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72 is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

FIG. 3a shows a flip chip type semiconductor die 90 having an active area 91 containing analog or digital circuits implemented as active devices, passive devices, conductive layers, and dielectric layers electrically interconnected according to the electrical design of the die. A plurality of solder bumps 92 is formed on contact pads on active area 91. A plurality of conductive through silicon vias (TSVs) 94 is formed by creating openings in the silicon region of semiconductor die 90 and filling the openings with conductive material such as Al, aluminum alloy, Cu, Sn, Ni, Au, or Ag. Conductive TSVs 94 extend from one side of semiconductor die 90 to the other side of the die and electrically connect to solder bumps 92. A substrate 96 is made with one or more layers of silicon, silicon carbide, polymer, polymer composite, metal, ceramic, glass, glass epoxy, beryllium oxide, or other rigid material for structural support. Substrate 96 contains an interconnect structure including contact pads 98 and 100. Semiconductor die 90 is mounted to substrate 96 so that solder bumps 92 electrically connect to contact pads 98.

A second flip chip type semiconductor die 102 includes an active area 104 with analog or digital circuits implemented as active devices, passive devices, conductive layers, and dielectric layers electrically interconnected according to the electrical design of the die. A plurality of solder bumps 106 is formed on contact pads on active area 104. Conductive TSVs 108 are formed by creating openings in the silicon region of semiconductor die 102 and filling the openings with conductive material such as Al, aluminum alloy, Cu, Sn, Ni, Au, or Ag. Conductive TSVs 108 extend from one side of semiconductor die 102 to the other side of the die and electrically connect to solder bumps 106. Semiconductor die 102 is mounted to substrate 96 so that solder bumps 106 electrically connect to contact pads 98.

Semiconductor die 90 and 102 may contain baseband circuits that are susceptible to electromagnetic interference (EMI), radio frequency interference (RFI), and other interference generated by other devices. In other embodiments, semiconductor die 90 and 102 may contain integrated passive devices (IPD) that generate EMI or RFI. For example, the IPDs contained within semiconductor die 90 and 102 provide the electrical characteristics needed for high frequency applications, such as high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device. In such systems, the output signal in the transmitter section of the radio frequency integrated circuit (RFIC) may interfere with the local oscillator (LO). The inductor can be used in the tank resonators of the LO in the RF transceiver. The LO includes a voltage-controlled oscillator (VCO) that is synchronized to an external crystal reference through a phase-locked loop (PLL). The VCO can be implemented as a cross-coupled amplifier circuit with a tuned resonant inductor-capacitor (LC) load. The inductor is made with one or two spiral inductor coils on the RFIC. External signals can couple into the VCO by magnetic induction directly into the tank resonator. If the external source is a periodic or quasi-periodic signal, it will introduce a spurious tone. In subsequent mixing, the RF signal is multiplied by the LO signal to transpose the band of interest down to low frequency for further signal processing. The presence of the spurious tone in the LO often causes out-of-band signals to be mixed into the base-band frequency range, which degrades the receiver sensitivity, adding both noise and cross-talk to the received signal. Therefore, each of these passive circuit elements has the potential to interfere with adjacent devices.

In FIG. 3b, an underfill material 110 is deposited between semiconductor die 90 and substrate 96, and between semiconductor die 102 and substrate 96, using spin coating, needle dispensing, or other suitable application process. The underfill material 110 can be an epoxy resin or inorganic filler.

An encapsulant or molding compound 112 is selectively or partially deposited between semiconductor die 90 and 102 and over substrate 96 using a printing, compressive molding, transfer molding, liquid encapsulant molding, or other suitable applicator so that the encapsulant does not extend above a top surface of semiconductor die 90 and 102. The encapsulant 112 can be made with epoxy resin, epoxy acrylate, polymer, or polymer composite material. The encapsulant 112 is non-conductive and environmentally protects the semiconductor device from external elements and contaminants.

An electrically conductive shielding layer 114 with an optional seed layer is conformally deposited over encapsulant 112 and semiconductor die 90 and 102. Shielding layer 114 electrically connects through conductive TSVs 94 and 108 to contact pads 98 in substrate 96. Shielding layer 114 can be Cu, Al, stainless steel, nickel silver, low-carbon steel, silicon-iron steel, foil, epoxy, conductive resin, and other metals and composites capable of blocking EMI, RFI, and other inter-device interference. The seed layer can be made with Cu, Ni, nickel vanadium (NiV), Au, or Al. The seed layer and shielding layer 114 are patterned and conformally deposited using an electrolytic plating, electroless plating, sputtering, PVD, CVD, or other suitable metal deposition process. For non-metal materials, shielding layer 114 can be applied by spraying or painting.

A typical RF system requires multiple IPDs and other high frequency circuits in one or more semiconductor packages to perform the necessary electrical functions. However, high frequency electrical devices generate undesired EMI, RFI, or other inter-device interference, such as capacitive, inductive, or conductive coupling, also known as cross-talk, which can interfere with the operation of adjacent or nearby circuit elements. Shielding layer 114 substantially covers all areas of encapsulant 112 relative to the top of semiconductor die 90 and 102 to provide protection for the enclosed semiconductor devices against EMI, RFI, or other inter-device interference. The interference can be generated internally or come from external semiconductor devices containing IPDs or RF circuits. Shielding 114 can also cover the encapsulant relative to the sides of semiconductor devices 90 and 102 and substrate 96.

Figure 3C:
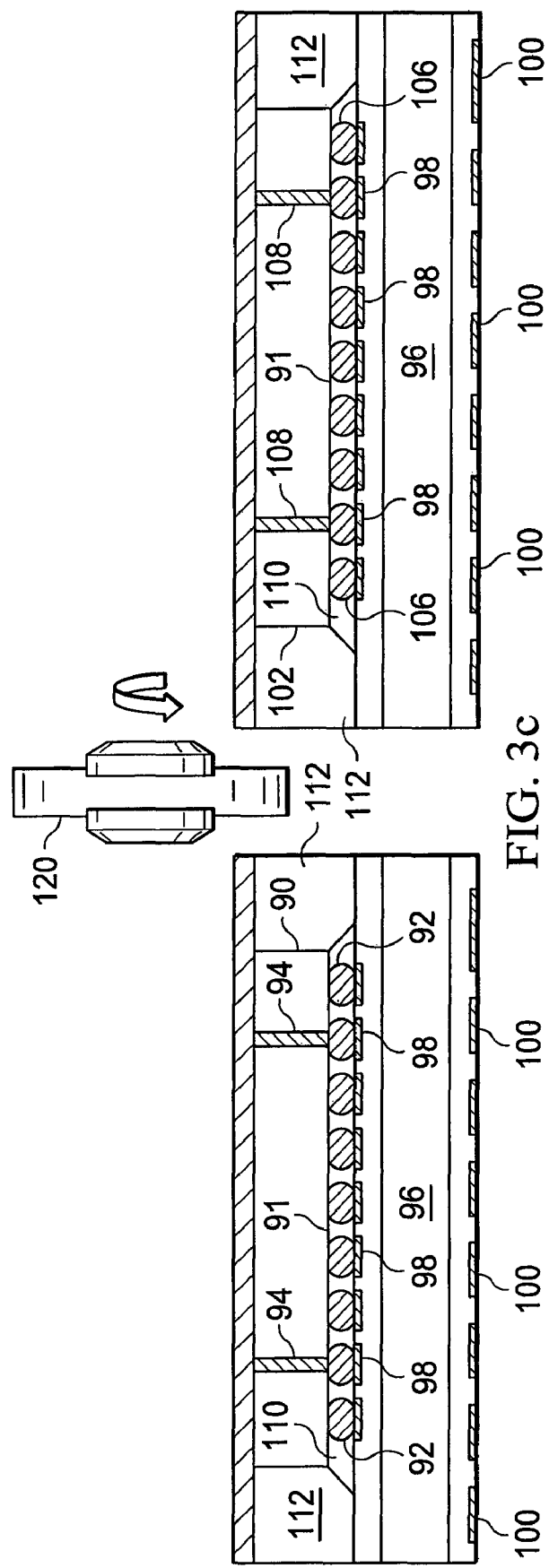

In FIG. 3c, substrate 96, encapsulant 112, and shielding layer 114 are singulated by cutting tool 120 to separate semiconductor die 90 and 102. Cutting tool 120 can be a saw blade or laser.

Figure 4:
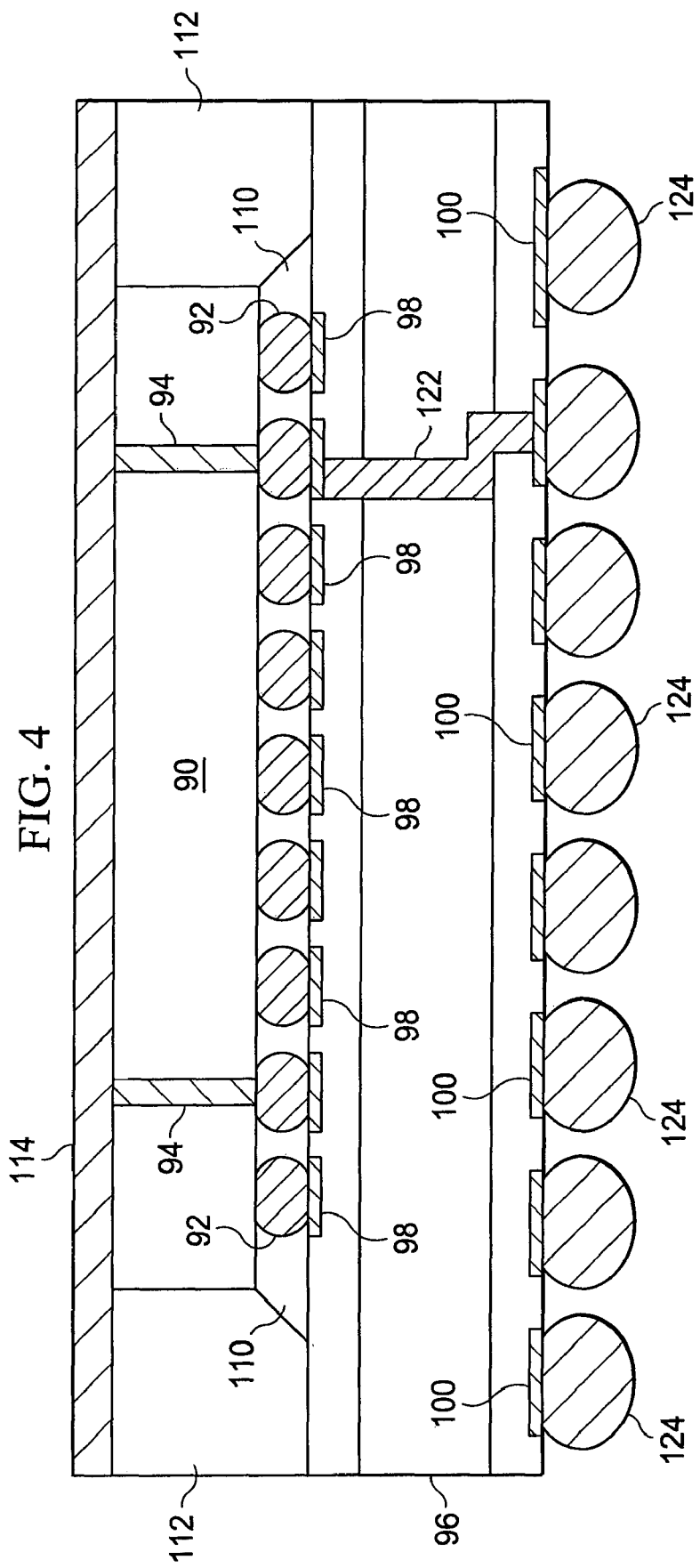
FIG. 4 illustrates further detail of the shielding layer with ground connection through a TSV.

FIG. 4 shows further detail of the electrical connection for shielding layer 114 through semiconductor die 90 and substrate 96. Shielding layer 114 electrically connects through conductive TSVs 94 of semiconductor die 90 to solder bumps 92 and contact pads 98 of substrate 96. A conductive channel 122 is formed in substrate 96 and interconnects contact pads 98 and 100. An electrically conductive solder material is deposited over contact pads 100 using an evaporation, electrolytic plating, electroless plating, ball drop, or screen printing process. The solder material can be any metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 124. In some applications, solder bumps 124 are reflowed a second time to improve electrical contact to contact pads 100. Solder bumps 124 are electrically connected to external ground potential to aid in the shielding feature of layer 114. Accordingly, shielding layer 114 is connected to ground potential through conductive TSVs 94, solder bumps 92, contact pads 98, conductive channel 122, contact pads 100, and solder bumps 124. By connecting the shielding layer to ground using TSVs, there is no need for additional manufacturing steps to form a dedicated ground connection. As an alternative interconnect structure, wire bonds can be connected to contact pads 100 for external interconnect including the ground connection.

Figure 5:
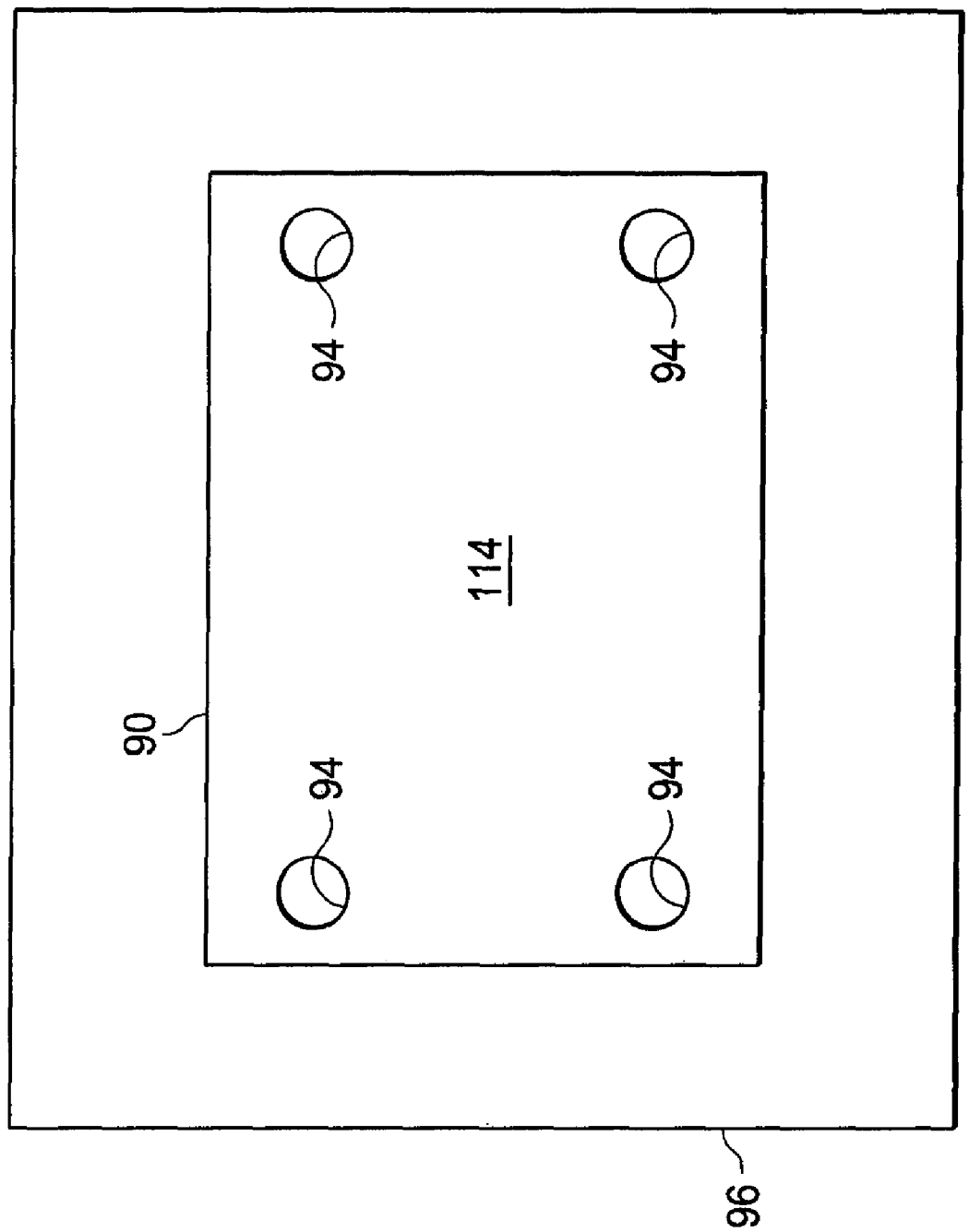
FIG. 5 illustrates a top view of the semiconductor device with TSV connection to a shielding layer.

FIG. 5 shows a top view of shielding layer 114 over semiconductor die 90 which is mounted to substrate 96. Conductive TSVs 94 connect to shielding layer 114.

Figure 6:
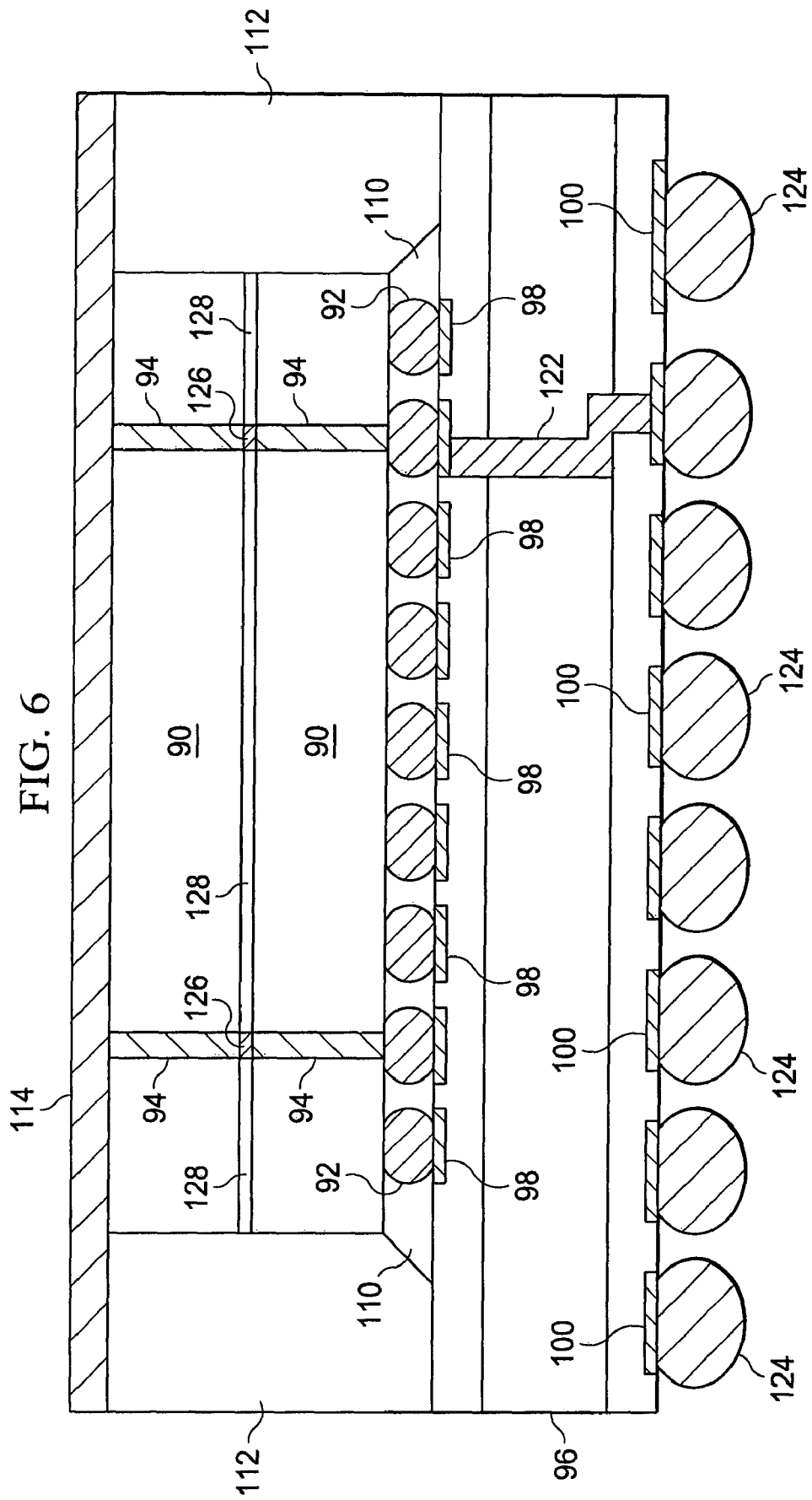
FIG. 6 illustrates two stacked semiconductor devices with TSV connection to a shielding layer.

FIG. 6 illustrates two stacked semiconductor die 90 under shielding layer 114. The stacked semiconductor die are joined with adhesive 128, such as thermal epoxy, polymer composite, or inorganic bonding compounds. Conductive TSVs 94 in both stacked semiconductor die 90 provide the electrical connection for shielding layer 114 to the interconnect structure in substrate 96. Conductive TSVs 94 are electrically connected with bonding agent 126, such as conductive adhesive, metal-to-metal bonding, or other suitable electrically conductive union.

Figure 7A:
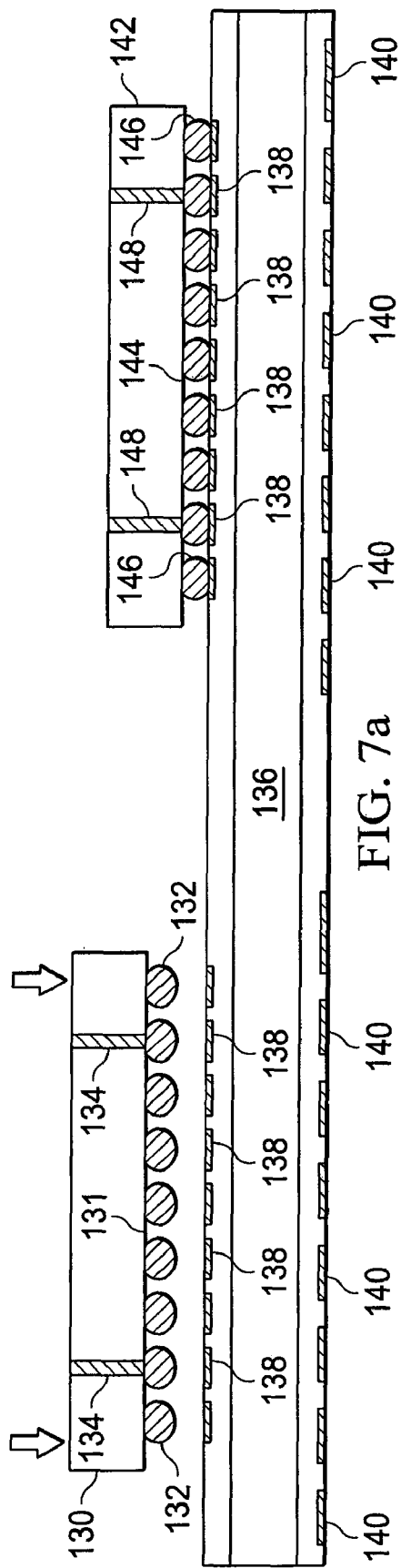
FIGS. 7a-7e illustrate an alternate process of forming a shielding layer with ground connection through a TSV in the semiconductor device.

An alternate process of forming the shielding layer over the semiconductor die is shown in FIGS. 7a-7e. In FIG. 7a, a flip chip type semiconductor die 130 has an active area 131 containing analog or digital circuits implemented as active devices, passive devices, conductive layers, and dielectric layers electrically interconnected according to the electrical design of the die. A plurality of solder bumps 132 is formed on contact pads on active area 131. A plurality of conductive TSVs 134 is formed by creating openings in the silicon region of semiconductor die 130 and filling the openings with conductive material such as Al, aluminum alloy, Cu, Sn, Ni, Au, or Ag. Conductive TSVs 134 extend from one side of semiconductor die 130 to the other side of the die and electrically connect to solder bumps 132. A substrate 136 is made with one or more layers of silicon, silicon carbide, polymer, polymer composite, metal, ceramic, glass, glass epoxy, beryllium oxide, or other rigid material for structural support. Substrate 136 contains an interconnect structure including contact pads 138 and 140. Semiconductor die 130 is mounted to substrate 136 so that solder bumps 132 electrically connect to contact pads 138.

A second flip chip type semiconductor die 142 includes an active area 144 with analog or digital circuits implemented as active devices, passive devices, conductive layers, and dielectric layers electrically interconnected according to the electrical design of the die. A plurality of solder bumps 146 is formed on contact pads on active area 144. Conductive TSVs 148 are formed by creating openings in the silicon region of semiconductor die 142 and filling the openings with conductive material such as Al, aluminum alloy, Cu, Sn, Ni, Au, or Ag. Conductive TSVs 148 extend from one side of semiconductor die 142 to the other side of the die and electrically connect to solder bumps 146. Semiconductor die 142 is mounted to substrate 136 so that solder bumps 146 electrically connect to contact pads 138.

Figure 7B:
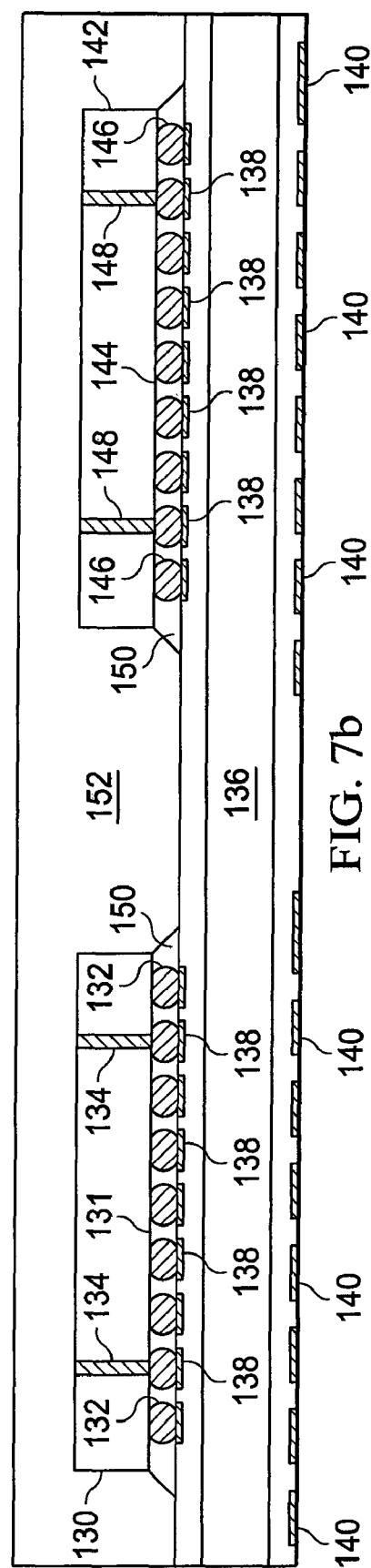

In FIG. 7b, an underfill material 150 is deposited between semiconductor die 130 and substrate 136, and between semiconductor die 142 and substrate 136, using spin coating, needle dispensing, or other suitable application process. The underfill material 150 can be an epoxy resin or inorganic filler.

An encapsulant or molding compound 152 is deposited over semiconductor die 130 and 142 and substrate 136 using a printing, compressive molding, transfer molding, liquid encapsulant molding, or other suitable applicator. The encapsulant 152 can be made with epoxy resin, epoxy acrylate, polymer, or polymer composite material. The encapsulant 152 is non-conductive and environmentally protects the semiconductor device from external elements and contaminants.

Figure 7C:
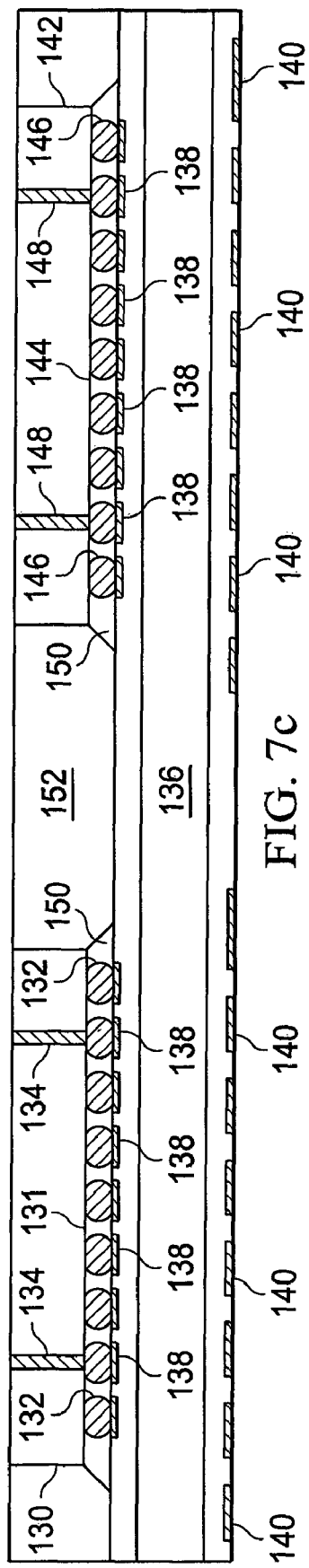

In FIG. 7c, a portion of encapsulant 152 above semiconductor die 130 and 142 is removed by backgrinding, silicon wet etching, dry etching, plasma etching, or CMP. The remaining portion of encapsulant 152 is flush with and does not extend above a top surface of semiconductor die 130 and 142.

Figure 7D:
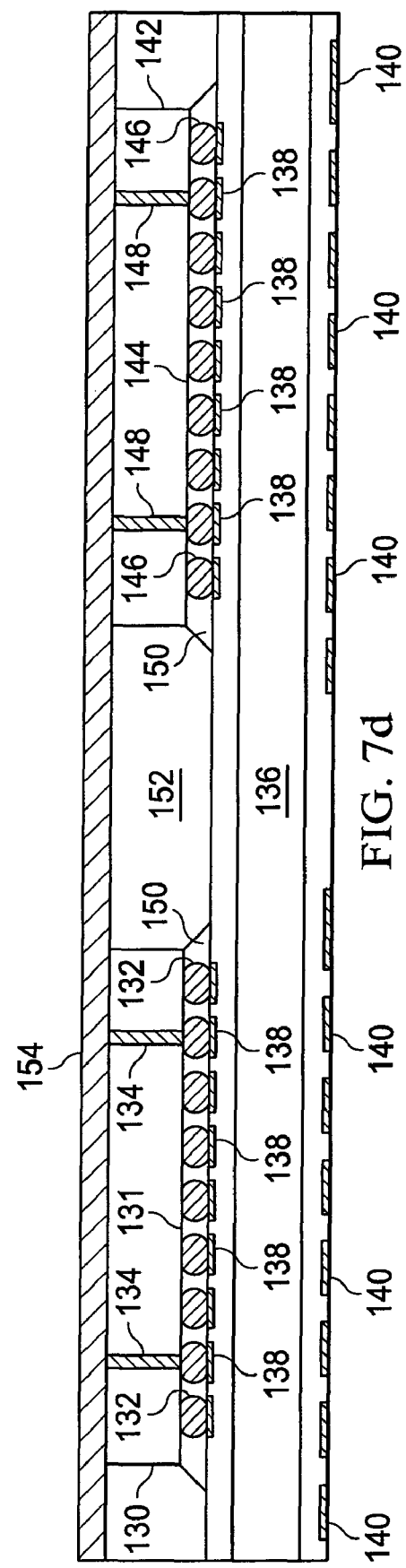

In FIG. 7d, an electrically conductive shielding layer 154 with an optional seed layer is conformally deposited over encapsulant 152 and semiconductor die 130 and 142. Shielding layer 154 electrically connects through conductive TSVs 134 and 148 to contact pads 138 in substrate 136. Shielding layer 154 can be Cu, Al, stainless steel, nickel silver, low-carbon steel, silicon-iron steel, foil, epoxy, conductive resin, and other metals and composites capable of blocking EMI, RFI, and other inter-device interference. The seed layer can be made with Cu, Ni, NiV, Au, or Al. The seed layer and shielding layer 154 are patterned and conformally deposited using an electrolytic plating, electroless plating, sputtering, PVD, CVD, or other suitable metal deposition process. For non-metal materials, shielding layer 154 can be applied by spraying or painting.

Shielding layer 154 substantially covers all areas of encapsulant 152 relative to the top of semiconductor die 130 and 142 to provide protection for the enclosed semiconductor devices against EMI, RFI, or other inter-device interference. The interference can come from external semiconductor devices containing IPDs or RF circuits. Shielding 154 can also cover the encapsulant relative to the sides of semiconductor devices 130 and 142 and substrate 136.

Figure 7E:
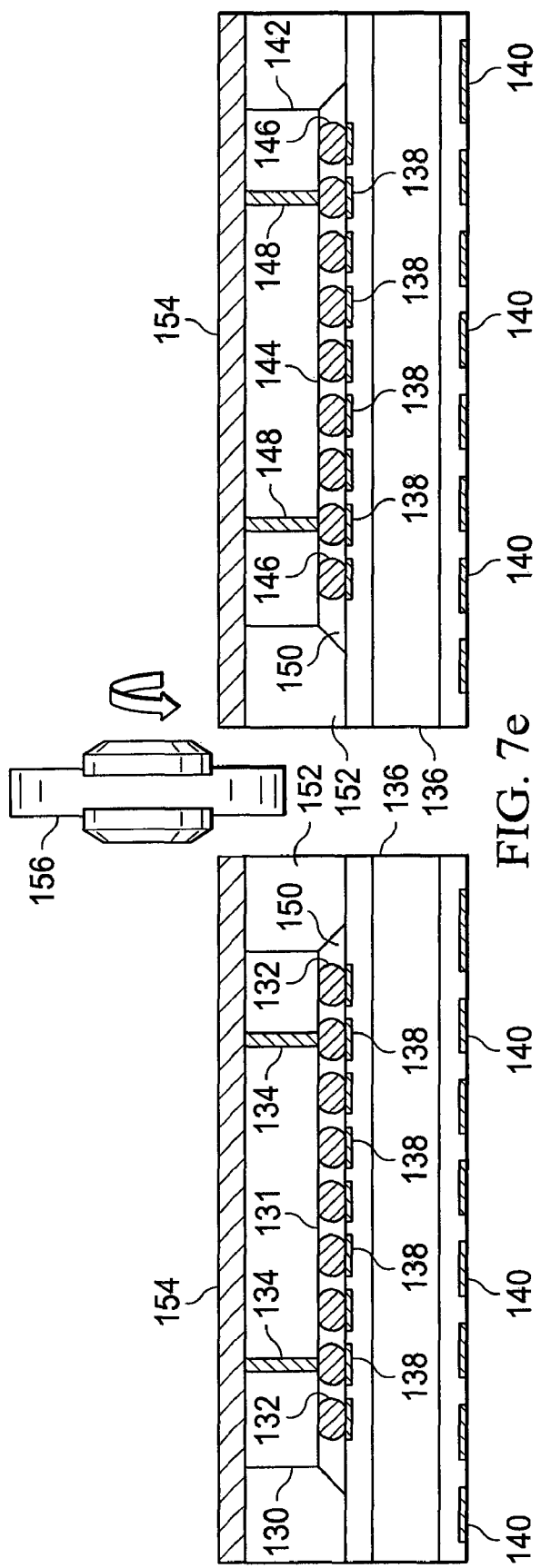

In FIG. 7e, substrate 136, encapsulant 152, and shield layer 154 are singulated by cutting tool 156 to separate semiconductor die 130 and 142. Cutting tool 156 can be a saw blade or laser.

Figure 8A:
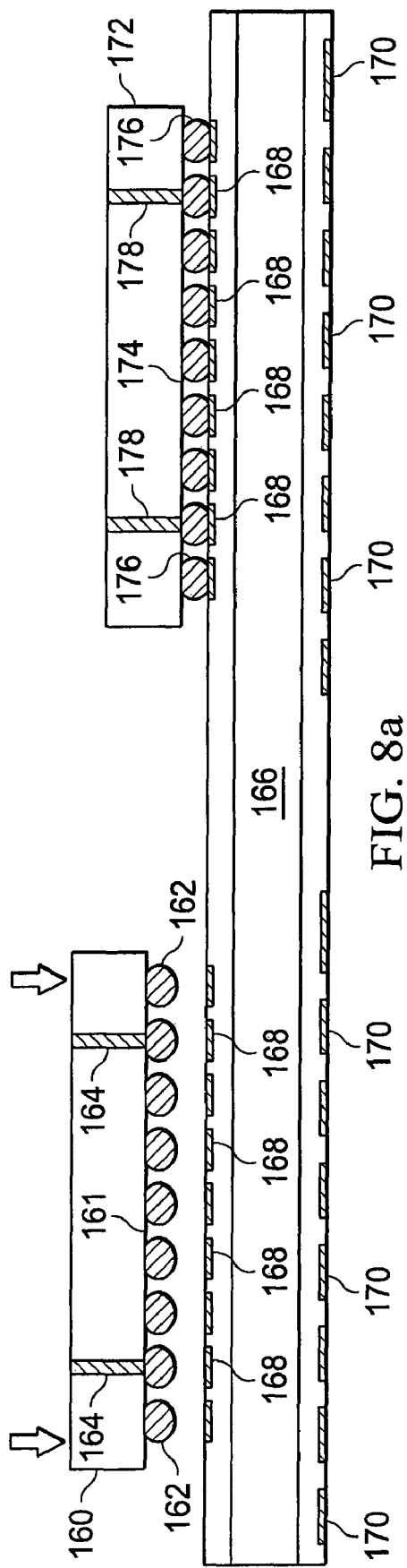
FIGS. 8a-8d illustrate a process of forming a shielding layer covering the substrate with ground connection through a TSV in the semiconductor device.

Another process of forming the shielding layer over the semiconductor die is shown in FIGS. 8a-8d. In FIG. 8a, a flip chip type semiconductor die 160 has an active area 161 containing analog or digital circuits implemented as active devices, passive devices, conductive layers, and dielectric layers electrically interconnected according to the electrical design of the die. A plurality of solder bumps 162 is formed on contact pads on active area 161. A plurality of conductive TSVs 164 is formed by creating openings in the silicon region of semiconductor die 160 and filling the openings with conductive material such as Al, aluminum alloy, Cu, Sn, Ni, Au, or Ag. Conductive TSVs 164 extend from one side of semiconductor die 160 to the other side of the die and electrically connect to solder bumps 162. A substrate 166 is made with one or more layers of silicon, silicon carbide, polymer, polymer composite, metal, ceramic, glass, glass epoxy, beryllium oxide, or other rigid material for structural support. Substrate 166 contains an interconnect structure including contact pads 168 and 170. Semiconductor die 160 is mounted to substrate 166 so that solder bumps 162 electrically connect to contact pads 168.

A second flip chip type semiconductor die 172 includes an active area 174 with analog or digital circuits implemented as active devices, passive devices, conductive layers, and dielectric layers electrically interconnected according to the electrical design of the die. A plurality of solder bumps 176 is formed on contact pads on active area 174. Conductive TSVs 178 are formed by creating openings in the silicon region of semiconductor die 172 and filling the openings with conductive material such as Al, aluminum alloy, Cu, Sn, Ni, Au, or Ag. Conductive TSVs 178 extend from one side of semiconductor die 172 to the other side of the die and electrically connect to solder bumps 176. Semiconductor die 172 is mounted to substrate 166 so that solder bumps 176 electrically connect to contact pads 168.

Figure 8B:
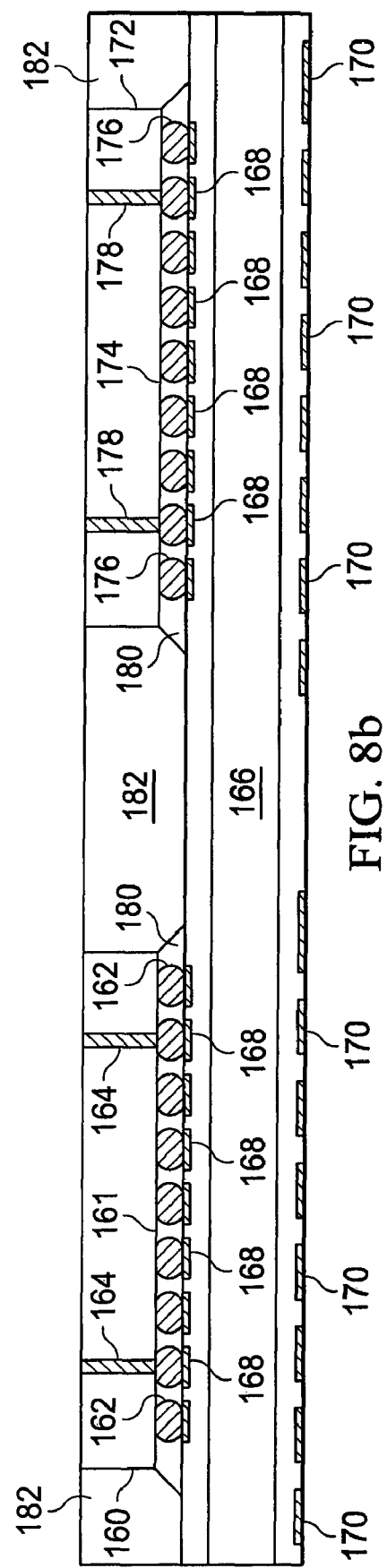

In FIG. 8b, an underfill material 180 is deposited between semiconductor die 160 and substrate 166, and between semiconductor die 172 and substrate 166, using spin coating, needle dispensing, or other suitable application process. The underfill material 180 can be an epoxy resin or inorganic filler.

An encapsulant or molding compound 182 is selectively or partially deposited between semiconductor die 160 and 172 and over substrate 166 using a printing, compressive molding, transfer molding, liquid encapsulant molding, or other suitable applicator so that the encapsulant does not extend above a top surface of semiconductor die 160 and 172. The encapsulant 182 can be made with epoxy resin, epoxy acrylate, polymer, or polymer composite material. The encapsulant 182 is non-conductive and environmentally protects the semiconductor device from external elements and contaminants.

Figure 8C:
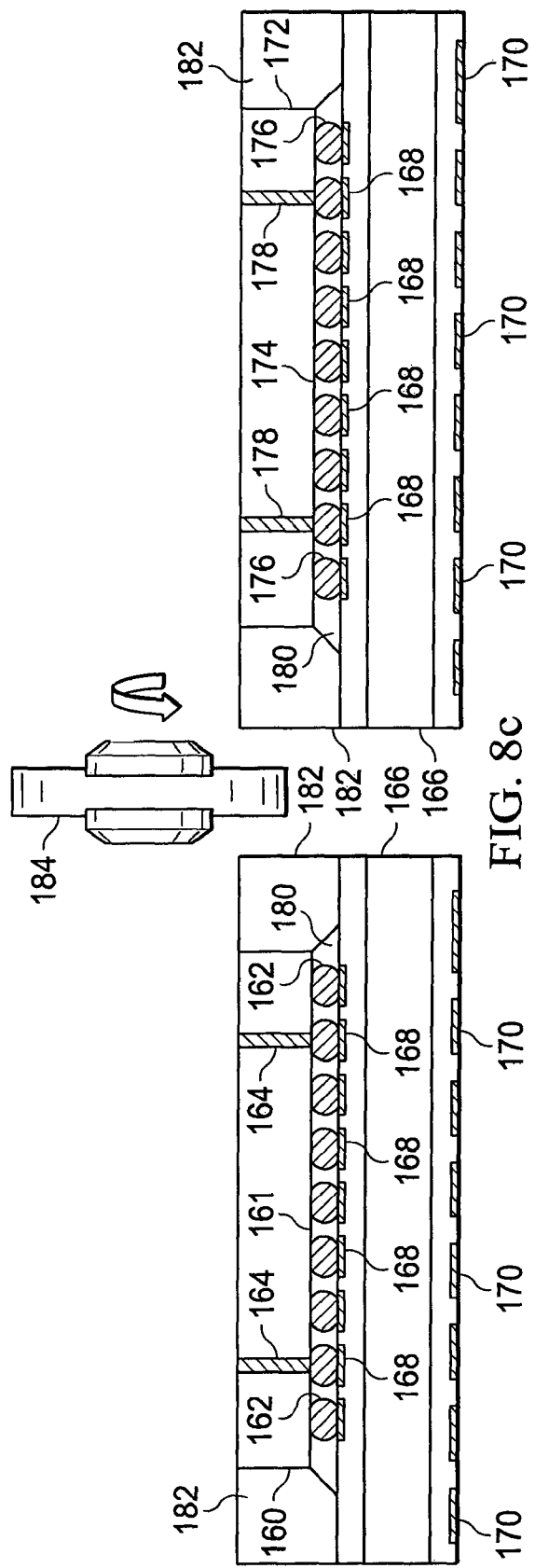

In FIG. 8c, substrate 166 and encapsulant 182 are singulated by cutting tool 184 to separate semiconductor die 160 and 172. Cutting tool 184 can be a saw blade or laser.

Figure 8D:
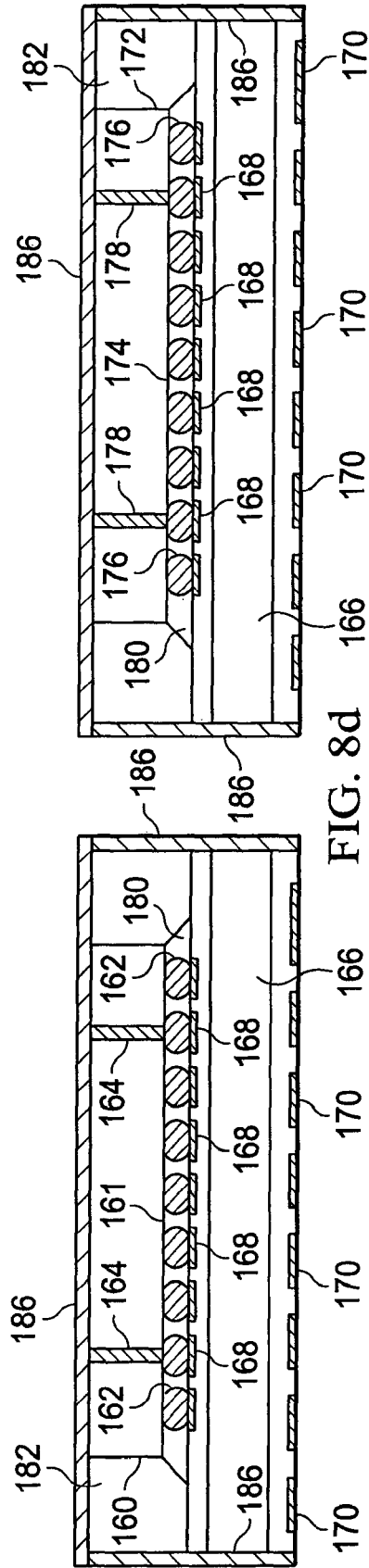

In FIG. 8d, an electrically conductive shielding layer 186 with an optional seed layer is conformally deposited over encapsulant 182 of each semiconductor die 160 and 172. Shielding layer 186 electrically connects through conductive TSVs 164 and 178 to contact pads 168 in substrate 166. Shielding layer 186 can be Cu, Al, stainless steel, nickel silver, low-carbon steel, silicon-iron steel, foil, epoxy, conductive resin, and other metals and composites capable of blocking EMI, RFI, and other inter-device interference. The seed layer can be made with Cu, Ni, NiV, Au, or Al. The seed layer and shielding layer 186 are patterned and conformally deposited using an electrolytic plating, electroless plating, sputtering, PVD, CVD, or other suitable metal deposition process. For non-metal materials, shielding layer 186 can be applied by spraying or painting.

Shielding layer 186 substantially covers all areas of encapsulant 182 relative to the top of semiconductor die 160 and 172 to provide protection for the enclosed semiconductor devices against EMI, RFI, or other inter-device interference. Shielding layer 186 extends down to cover the sides of semiconductor devices 160 and 172 and substrate 166. The interference can come from external semiconductor devices containing IPDs or RF circuits.

FIG. 9 shows further detail of the electrical connection for shielding layer 186 through semiconductor die 160 and substrate 166. Shielding layer 186 electrically connects through conductive TSVs 164 of semiconductor die 160 to solder bumps 162 and contact pads 168 of substrate 166. A conductive channel 188 is formed in substrate 166 and interconnects contact pads 168 and 170. An electrically conductive solder material is deposited over contact pads 170 using an evaporation, electrolytic plating, electroless plating, ball drop, or screen printing process. The solder material can be any metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 190. In some applications, solder bumps 190 are reflowed a second time to improve electrical contact to contact pads 170. One or more solder bumps 190 are electrically connected to external ground potential to aid in the shielding feature of layer 186. Accordingly, shielding layer 186 is connected to ground potential through conductive TSVs 164, solder bumps 162, contact pads 168, conductive channel 188, contact pads 170, and solder bumps 190. By connecting the shielding layer to ground using TSVs, there is no need for additional manufacturing steps to form a dedicated ground connection. As an alternative interconnect structure, wire bonds can be connected to contact pads 170.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
    providing a substrate having an interconnect structure;
    providing a plurality of semiconductor dies each having a through silicon via (TSV);
    mounting the semiconductor dies to the substrate to electrically connect the TSV to the interconnect structure;
    depositing an encapsulant between the semiconductor dies;
    forming a shielding layer over the encapsulant and semiconductor dies;
    electrically connecting the shielding layer to the TSV which in turn electrically connects to the interconnect structure to isolate the semiconductor dies from interference; and
    singulating the substrate to separate the semiconductor dies.

2. The method of claim 1, further including electrically connecting the shielding layer to a ground potential through the TSV and interconnect structure.

3. The method of claim 1, further including forming the shielding layer over the substrate.

4. The method of claim 1, further including:
    forming solder bumps on the semiconductor dies;
    electrically connecting the solder bumps to the TSV; and
    electrically connecting the solder bumps to contact pads on the substrate.

5. The method of claim 1, further including:
    forming solder bumps on the substrate;
    forming a conductive channel in the interconnect structure and electrically connecting the solder bumps to the conductive channel; and
    electrically connecting the conductive channel in the interconnect structure to the TSV.

6. The method of claim 1, further including:
    stacking a plurality of semiconductor dies prior to forming the shielding layer, each semiconductor dies having a TSV;
    electrically connecting the stacked semiconductor dies through the TSV;
    forming the shielding layer over the stacked semiconductor dies; and
    electrically connecting the shielding layer to the TSV.

7. The method of claim 1, further including disposing an underfill material under the semiconductor dies.

8. A method of making a semiconductor device, comprising:
    providing a substrate having an interconnect structure;
    providing a plurality of semiconductor dies each having a through silicon via (TSV);
    mounting the semiconductor dies to the substrate to electrically connect the TSV to the interconnect structure;
    depositing an encapsulant over the semiconductor dies;
    removing the encapsulant extending above the semiconductor dies;
    forming a shielding layer over the encapsulant and semiconductor dies;
    electrically connecting the shielding layer to the TSV which in turn electrically connects to the interconnect structure to isolate the semiconductor dies from interference; and
    singulating the substrate to separate the semiconductor dies.

9. The method of claim 8, further including electrically connecting the shielding layer to a ground potential through the TSV and interconnect structure.

10. The method of claim 8, further including forming the shielding layer over the substrate.

11. The method of claim 8, further including:
    forming solder bumps on the semiconductor dies;
    electrically connecting the solder bumps to the TSV; and
    electrically connecting the solder bumps to contact pads on the substrate.

12. The method of claim 8, further including:
    forming solder bumps on the substrate;
    forming a conductive channel in the interconnect structure and electrically connecting the solder bumps to the conductive channel; and
    electrically connecting the conductive channel in the interconnect structure to the TSV.

13. The method of claim 8, further including depositing an underfill material under the semiconductor dies.

14. The method of claim 8, further including:
    stacking a plurality of semiconductor dies prior to forming the shielding layer, each semiconductor dies having a TSV;
    electrically connecting the stacked semiconductor dies through the TSV;
    forming the shielding layer over the stacked semiconductor dies; and
    electrically connecting the shielding layer to the TSV.

15. The method of claim 8, further including disposing an underfill material under the semiconductor dies.

16. A method of making a semiconductor device, comprising:
    providing a substrate having an interconnect structure;
    providing a plurality of semiconductor dies having each a through silicon via (TSV);
    mounting the semiconductor dies to the substrate to electrically connect the TSV to the interconnect structure;
    depositing an encapsulant between the semiconductor dies;
    forming a shielding layer over the encapsulant and semiconductor dies; and
    electrically connecting the shielding layer to the TSV which in turn electrically connects to the interconnect structure to isolate the semiconductor dies from interference.

17. The method of claim 16, further including electrically connecting the shielding layer to a ground potential through the TSV and interconnect structure.

18. The method of claim 16, further including forming the shielding layer over the substrate.

19. The method of claim 16, further including:
    forming solder bumps on the semiconductor dies;
    electrically connecting the solder bumps to the TSV; and
    electrically connecting the solder bumps to contact pads on the substrate.

20. The method of claim 16, further including:
    stacking the plurality of semiconductor dies prior to forming the shielding layer, each semiconductor dies having a TSV;

electrically connecting the stacked semiconductor dies through the TSV;

forming the shielding layer over the stacked semiconductor dies; and electrically connecting the shielding layer to the TSV.

21. A semiconductor device, comprising:

a substrate having an interconnect structure;

a plurality of semiconductor dies having each a through silicon via (TSV), the semiconductor dies being mounted to the substrate to electrically connect the TSV to the interconnect structure;

an encapsulant deposited between the semiconductor dies; and a shielding layer formed over the encapsulant and semiconductor dies, the shielding layer being electrically connected to the TSV which in turn electrically connects to the interconnect structure to isolate the semiconductor dies from interference.

22. The semiconductor device of claim 21, wherein the shielding layer is electrically connected to a ground potential through the TSV and interconnect structure.

23. The semiconductor device of claim 21, further including a plurality of solder bumps formed on the semiconductor dies, the solder bumps being electrically connected to the TSV and the solder bumps being electrically connected to contact pads on the substrate.

24. The semiconductor device of claim 21, wherein the plurality of semiconductor dies are stacked and disposed under the shielding layer, the stacked semiconductor dies being electrically connected through the TSV and the shielding layer being electrically connected to the TSVs.

25. The semiconductor device of claim 21, further including an underfill material disposed under the semiconductor dies.

* * * * *